United States Patent [19]

Pitzer et al.

[11] Patent Number: 4,561,168
[45] Date of Patent: Dec. 31, 1985

[54] METHOD OF MAKING SHADOW ISOLATED METAL DMOS FET DEVICE

[75] Inventors: Dorman C. Pitzer, Sunnyvale; Edward J. Rice, Los Gatos, both of Calif.

[73] Assignee: Siliconix Incorporated, Santa Clara, Calif.

[21] Appl. No.: 443,765

[22] Filed: Nov. 22, 1982
(Under 37 CFR 1.47)

[51] Int. Cl.⁴ .......................................... H01L 21/22
[52] U.S. Cl. .................................. 29/571; 29/577 C; 29/578; 29/579; 148/1.5; 148/187; 156/653; 156/655; 357/23.1; 357/65
[58] Field of Search ...................... 29/571, 577 C, 578, 29/579; 148/1.5, 187; 156/653, 655; 357/23, 59, 65

[56] References Cited

U.S. PATENT DOCUMENTS

| | | | |
|---|---|---|---|
| 4,187,125 | 2/1980 | Feist | 148/1.5 |
| 4,368,573 | 1/1983 | DeBrebisson et al. | 29/576 R |
| 4,374,454 | 2/1983 | Jochems | 29/571 |
| 4,402,761 | 9/1983 | Feist | 148/1.5 |
| 4,403,396 | 9/1983 | Stein | 29/571 |
| 4,413,402 | 11/1983 | Erb | 29/571 |
| 4,419,811 | 12/1983 | Rice | 29/571 |
| 4,437,925 | 3/1984 | Cogan | 156/653 |

Primary Examiner—Upendra Roy
Attorney, Agent, or Firm—Steven F. Caserza; Alan H. MacPherson; Terrence E. Dooher

[57] ABSTRACT

An MOS transistor which is suitable for use in the VHF and UHF regions is fabricated in a semiconductor substrate, with the substrate serving as the drain. A body region is formed within the substrate. A layer of insulation is formed over the surface of the device, and a via is formed in the insulation layer to expose those portions of the body region where a groove is to be cut. A groove is then formed in such a manner as to cause the insulation layer to overhang the edge of the groove. A source region is then formed in the exposed portions of the body region beneath the insulation layer. A source electrode and gate electrode are then simultaneously formed, with the overhang of the insulation layer causing the source electrode and the gate electrode to be physically and electrically separated from each other. Well known processing techniques are then used, if desired, to form a second metalization layer to serve as electrical interconnects, and to provide a scratch protection layer.

In accordance with another embodiment of this invention, a lateral MOS transistor is constructed where the drain region is formed in the substrate simultaneously with the formation of the source region.

24 Claims, 15 Drawing Figures

METHOD OF MAKING SHADOW ISOLATED METAL DMOS FET DEVICE

BACKGROUND

1. Field of the Invention

This invention relates to transistor devices and more specifically to MOS transistor devices capable of operating in the VHF and UHF regions.

2. Description of The Prior Art

Figure 1:
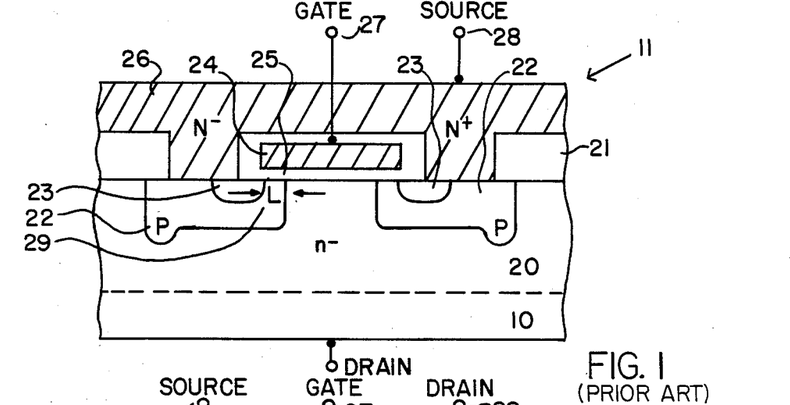
FIG. 1 is a cross-sectional view of a prior art MOS transistor.

MOS transistors are well known in the prior art. One such MOS transistor 11 useful in the VHF region is shown in FIG. 1. Formed on N type silicon substrate 10 is N type epitaxial silicon layer 20. Formed within epitaxial silicon layer 20 is P type region 22 which serves as the body of the transistor of FIG. 1. Located within body region 22 is N type region 23 which serves as the source. Located above and insulated from source region 23 and body region 22 by gate insulation 25 is gate electrode 24. Making electrical contact with source 23 and body region 22 is source electrode 26, allowing electrical connection between body 22 and source 23 to external devices (not shown). The substrate 10 serves as the drain of the transistor.

In response to a gate voltage applied to gate electrode 24 which is greater than the threshold voltage $V_t$ of transistor 11 (i.e., the voltage required to be applied to gate electrode 24 in order to cause transistor 11 to turn on), a sufficient number of electrons are attracted to channel region 29 (having length L), thereby allowing current to flow between source region 23 and drain 10 through channel 29 and epitaxial silicon region 20. Conversely, with a voltage less than the threshold voltage $V_t$ applied to the gate electrode 24, sufficient electrons will not be attracted to channel 29, thereby preventing current flow between source region 23 and drain 10 through channel 29 and epitaxial silicon region 20.

MOS transistor 11 of FIG. 1 is widely used for high frequency power switching devices. Gate electrode 24 typically comprises polycrystalline silicon which, because of its relatively high sheet resistivity of approximately 30 ohms per square, limits the operating frequency of transistor 11 to a maximum frequency of approximately 1 to 2 MHz, which is well below the very high frequency (VHF) and ultrahigh frequency (UHF) frequency ranges, which typically extend as high as 300 MHz, and in excess of 1,000 MHz, respectively. When gate electrode 24 comprises a metal, for example aluminum or an alloy thereof, the sheet resistivity of gate electrode 24 is quite low. In this event, the operating frequency range of transistor 11 is limited by the input and output capacitances of transistor 11. The output capacitance of transistor 11 is caused by the capacitance formed across the PN junction between P type body region 22 and N type epitaxial region 20. The power gain bandwidth (i.e., the band of frequencies over which the power gain meets or exceeds a desired value) is inversely proportional to the output capacitance. Accordingly, it is desirable to minimize the output capacitance of a transistor in order to increase its power gain bandwidth. The output capacitance of MOS transistor 11 is approximately 7 pF for each centimeter of channel width (with the width of channel 29 being measured perpendicular to the cross-sectional view of FIG. 1).

The input capacitance of MOS transistor 11 of FIG. 1 is caused by the overlap of gate electrode 24 and source region 23. Thus, the greater the amount of overlap between gate electrode 24 and source 23, the greater the input capacitance of MOS transistor 11. The maximum frequency of operation $f_t$ is directly proportional to the transconductance $g_m$ and inversely proportional to the input capacitance $C_{in}$:

$$f_t \propto g_m/C_{in} \qquad (1)$$

where
 $f_t$ = the maximum operating frequency;
 $g_m$ = the transconductance; and
 $C_{in}$ = the input capacitance.
Furthermore, $$g_m \propto W\mu_n/L \qquad (2)$$

where
 W = the channel width (measured perpendicular to the cross-sectional views shown in the Figures);
 $\mu_n$ = the electron mobility in the channel; and
 L = the channel length.
Thus, since $C_{in} \propto L$, it follows from equations (1) and (2), $$f_t \propto \mu_n/L^2. \qquad (3)$$

Thus, the greater the input capacitance of MOS transistor 11, the lower the operating frequency of transistor 11. A typical input capacitance for a MOS transistor 11 is approximately 12 pF for each centimeter of channel width.

Figure 2:
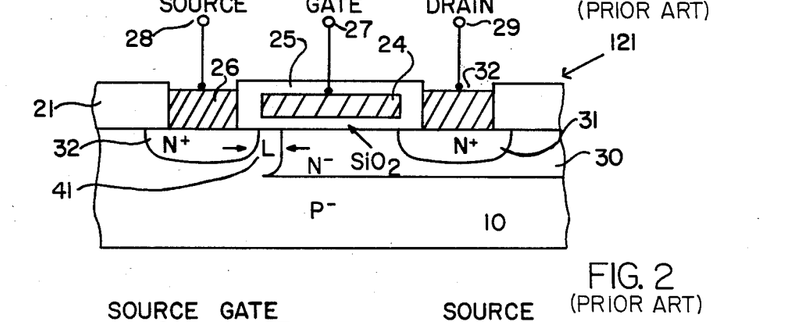
FIG. 2 is a cross-sectional view of another prior art MOS transistor.

Another prior art MOS transistor 121 is shown in the cross sectional view of FIG. 2. Formed in P type substrate 10 is N type source region 32 and N type drain region 31. Surrounding drain region 31 is N type drift region 30 having a relatively low dopant concentration. Located above and insulated from source region 32, drain region 31, drift region 30 and substrate 10 by gate insulation 25 is gate electrode 24. When a voltage greater than the threshold voltage $V_t$ of transistor 121 is applied to gate electrode 24 via gate terminal 27, electrons are attracted to the channel region 41 (having length L), thereby allowing current to flow between source region 32 and drain region 31 through the channel 41 and drift region 30. Conversely, with a voltage less than the threshold voltage $V_t$ applied to gate electrode 24 via gate terminal 27, sufficient electrons will not be attracted to the channel 41, thereby preventing current flow between source region 32 and drain region 31.

Figure 3:
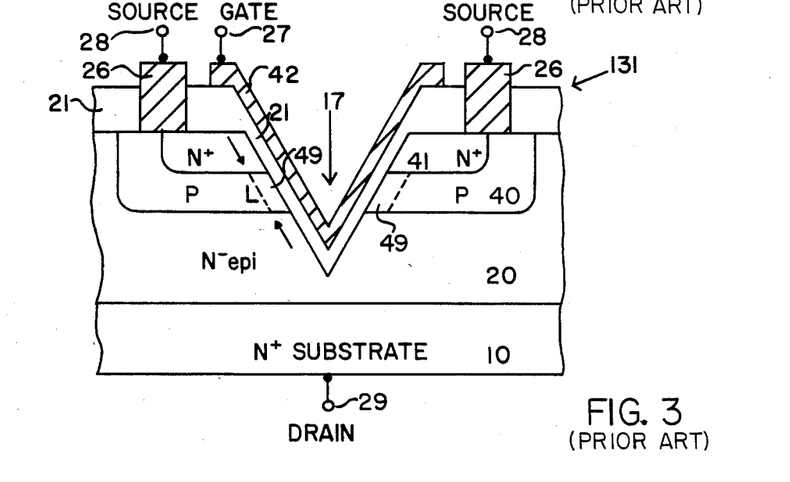
FIG. 3 is a cross-sectional view of a prior art MOS transistor utilizing a V groove.

Another prior art MOS transistor 131 suitable for use at VHF is depicted in the cross sectional view of FIG. 3. N type substrate 10 serves as the drain of the device. Formed on N type substrate 10 is N type epitaxial silicon layer 20 of relatively low dopant concentration. Formed within epitaxial layer 20 is P type body region 40 and formed within P type body region 40 is N type source 41. A V type groove 17 is cut into N type source 41, P type body region 40, and partially into N type epitaxial region 20, as shown. A layer of insulation 21 is then formed on the surface of the device, including the surface of the V type groove 17. Source electrode 26 and gate electrode 42 are then formed allowing electrical connection from gate 42 and source 41, to external devices (not shown). When a voltage greater than the threshold voltage $V_t$ of transistor 131 is applied to gate electrode 42 via gate terminal 27, a sufficient number of electrons are attracted to the channel region 49 (having length L) to cause channel 49 to become sufficiently N type to allow current to flow between source region 41 and drain region 10 through channel 49 and N type epitaxial region 20. Conversely, when a voltage less than the threshold voltage $V_t$ of transistor 131 is applied to gate electrode 42, the channel region 49 remains sufficiently P type to prevent current flow between N type source 41 and N type drain 10.

Figure 4:
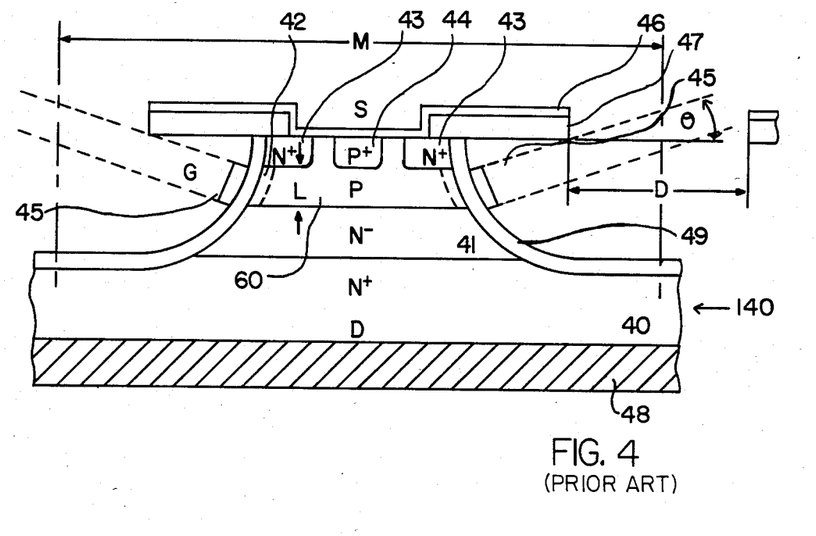
FIG. 4 is a cross-sectional view of a prior art MOS transistor wherein the gate electrode is formed in the "shadow" of the source electrode.

Yet another prior art MOS transistor 140 suitable for use in the VHF region is shown in the cross-sectional view of FIG. 4. This structure is also described in an article by Oakes, et al. entitled "A Power Silicon Microwave MOS Transistor", IEEE Transactions on Microwave Theory and Techniques, Volume MTT-24, No. 6, June, 1976, pages 305–311, which is hereby incorporated by reference. The transistor of FIG. 4 includes N type substrate 40 which serves as the drain of the device, and gold drain contact 48 applied to the backside of substrate 40, thereby allowing low resistivity electrical connection to the drain 40. The transistor of FIG. 4 also includes N type drift region 41 of relatively low dopant concentration, P type body region 60 containing channel region 42, P+ region 44 which provides electrical contact to body region 60, and N+ source region 43. A groove is cut thereby exposing the surface of N type source region 43, P type body region 60, and N type drift region 41. A thin layer of gate oxide 49 is then formed on these exposed surfaces, and a gate electrode 45 is formed adjacent to, but insulated from, channel region 42.

While the Oakes, et al., structure of FIG. 4 is suitable for use in the VHF region, the Oakes structure is extremely difficult to fabricate because the wafer must be precisely oriented with respect to the direction from which the metal is deposited in order to allow the metalization to form gate region 45 at the proper location adjacent to channel region 42. Thus, the angle ζ between the source oxide 47 and the gate metallization 45 must be precisely controlled. Furthermore, the distance D between adjacent source oxide regions 47 must be precisely controlled in order to allow proper formation of the metal gate region 45.

Another disadvantage of the Oakes, et al., structure of FIG. 4 is that the channel region 42 between N type source region 43 and drift region 41 is located primarily on the <111> silicon surface, due to the isotropic etching used to expose the surfaces of source region 43, channel region 42, and drift region 41 prior to formation of gate oxide 49. The <111> surface provides a lower electron mobility (i.e., typically 450 cm$^2$/volt-second) and thus a lower transconductance in the channel region than if the channel region 42 were formed on the <100> crystal surface, which has a typical electron mobility of 650 cm$^2$/volt-second. See, for example "Electron mobility in Inversion and Accumulation Layers on Thermally Oxidized Silicon Surfaces", S. C. Sun and J. D. Plummer, IEEE Transactions on Electron Devices, ED-27, 8, 1980 (pp. 1497–1508), which is hereby incorporated by reference. As previously described, the maximum operating frequency $f_t$ is directly proportional to the transconductance $g_m$, and thus the lower transconductance provided by the <111> surface as compared with the <100> surface limits the maximum operating frequency.

Another disadvantage in the Oakes, et al., structure of FIG. 4 is that the body region 42 must be sufficiently wide to allow both the N type source 43 and the P type body contact diffusion 44 to be separated from each other and yet contacted by the source metalization 46. This requirement means that the Oakes, et al. transistor must be of a rather large size, and thus have a rather high parasitic output capacitance because, as previously described, the output capacitance is caused by the capacitance provided by the PN junction formed between P type body region and N type drift region 41. This high output capacitance limits the power gain bandwidth of transistor 140, as previously described.

Figure 5:
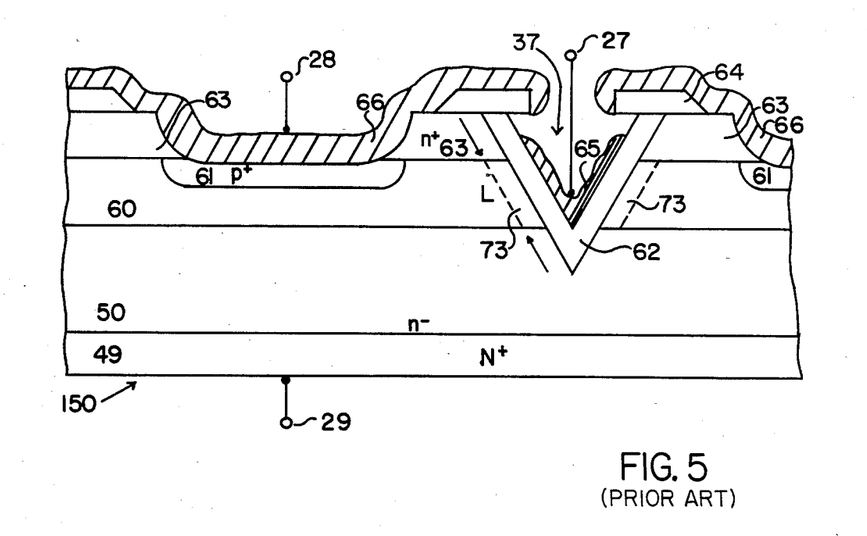
FIG. 5 is a cross-sectional view of a prior art MOS transistor utilizing a V groove wherein the gate electrode is formed in the "shadow" of the source electrode.

Another prior art MOS transistor 150 suitable for use in the VHF region is shown in the cross-sectional view of FIG. 5. The structure of FIG. 5 includes N type silicon substrate 49 which serves as the drain, and N type epitaxial layer 50, P type body region 60 which contains channel region 73, P type body contact region 61, and N type source region 63. A layer of oxide 64 is formed on the surface of the device and a V type groove 37 is formed, thereby to expose the surface of N type source region 63 and P type body region 60. A gate oxide layer 62 is formed on the surface of the groove. Metal is subsequently applied thereby forming source electrode 66 and gate electrode 65. Channel region 73 is located in the portion of body region 60 adjacent to gate oxide layer 62. When a gate voltage is applied to gate electrode 65 which is greater than the threshold $V_t$ of transistor 150, a sufficient number of electrons are attracted to the channel region 73 to allow current to flow between source 63 and drain 49 through channel 73, and epitaxial layer 50. Conversely, when a gate voltage is applied to gate electrode 65 which is less than the threshold $V_t$ of the transistor 150, an insufficient number of electrons are attracted to channel region 73, thereby preventing current flow between source 63 and drain 49.

The transistor 150 of FIG. 5 has several disadvantages. Due to the use of an anisotropic etch to form V groove 37, the channel region 73 is formed on the <111> silicon surface, thereby resulting in lower electron mobility and thus lower transconductance than if a channel were formed on the <100> silicon surface, thereby providing a low maximum operating frequency $f_t$, as previously described in conjunction with transistor 140 of FIG. 4. Furthermore, the body region 60 must be sufficiently wide between adjacent V grooves to allow both source region 63 and body contact region 61 to be contacted by the source metalization 66. This results in a rather large cell size (typically 23 microns between the lowest points of adjacent interdigitated grooves) and thus a rather large parasitic output capacitance caused by the PN junction formed between P type body region 60 and N type drain 50. This output capacitance is typically 8 pF for each centimeter of channel width (channel width being measured in a direction perpendicular to the cross-sectional view of FIG. 5). As previously described, such a large output capacitance also provides a low power gain bandwidth for transistor 150.

Bipolar transistors are also used in the VHF and UHF regions. However, such bipolar transistors have disadvantages, including their susceptibility to thermal run-away.

SUMMARY

In accordance with the teachings of this invention, an MOS transistor is fabricated which is suitable for use in the VHF and UHF regions. In accordance with one embodiment of this invention, an MOS transistor is fabricated in a semiconductor substrate, with the substrate serving as the drain. A body region is formed within the substrate. A layer of insulation is formed over the surface of the device, and a via is formed in the insulation layer to expose those portions of the body region where a groove is to be cut. A groove is then formed in such a manner as to cause the insulation layer to overhang the edge of the groove. A source region is then formed in those parts of the exposed portions of the body region that lie beneath the insulation layer. A sorce electrode and gate electrode are then simultaneously formed, with the overhang of the insulation layer causing the source electrode and the gate electrode to be physically and electrically separated from each other. Well known processing techniques are then used, if desired, to form a second metalization layer to serve as electrical interconnects, and to provide a scratch protection layer.

In accordance with another embodiment of this invention, a lateral MOS transistor is constructed as described above, which does not use the substrate as the drain. In this embodiment of the invention, a drain region is formed in the substrate simultaneously with the formation of the source region.

DETAILED DESCRIPTION

Figure 6:
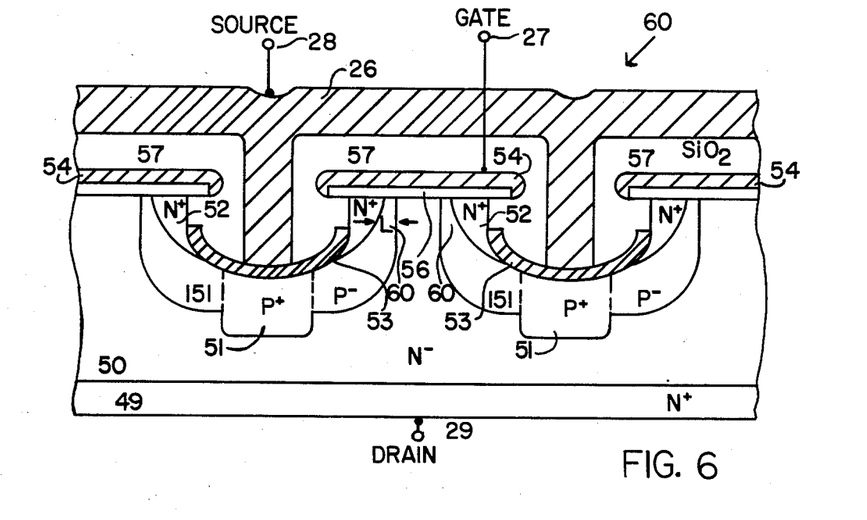
FIG. 6 is a cross-sectional view of one embodiment of an MOS transistor constructed in accordance with this invention wherein the source electrode is formed within the "shadow" of the gate electrode.

FIG. 6 is a cross-sectional view of an MOS transistor 60 constructed in accordance with one embodiment of this invention. The transistor 60 of FIG. 6 includes N type substrate 49 which serves as the drain. Drain terminal 29 is provided in a well known manner, such as by the formation of a gold contact layer (not shown) to the backside of substrate 49, thereby providing a low resistivity electrical connection to drain 49. Formed on substrate 49 is N type epitaxial silicon layer 50. Formed within epitaxial layer 50 is body region 51, 151 which is of P type conductivity. Body region 51, 151 typically comprises an annular region, or a region containing a plurality of interdigitated "fingers", thereby allowing transistor 60 to have a rather large channel width, and thus the ability to switch large amounts of current, while being formed in a rather small piece of semiconductor material. This use of a plurality of interdigitated fingers is well known to those of ordinary skill in the art. Because body region 51, 151 is interdigitated when viewed from the top of the device, the cross-sectional view of FIG. 6 shows two separate body regions 51, 151. Formed adjacent to body region 51, 151 is N type source region 52, as shown. Channel region 60 (having length L) is located between source region 52 and epitaxial layer 50.

Formed above source region 52, body region 51, and epitaxial silicon layer 50 is insulation layer 56, which typically comprises an oxide of silicon, such as $SiO_2$. Of importance, this insulation layer 56 extends over the edge of N type source region 52. The purpose of this overlap is to provide a "shadow" during the formation of metal gate electrode 54 and metal source electrode 53, as is more fully described later. Thus, when metal gate electrode 54 and metal source electrode 53 are simultaneously formed, for example by the evaporation of aluminum or an alloy thereof in a well known manner, the "shadow" provided by the overlap of insulation region 56 insures that source metal 53 is formed to a specified distance beneath insulation layer 56, and therefore two electrically independent metal regions 53 and 54 are formed simultaneously in one process step.

After the formation of source electrode 53 and gate electrode 54, another insulation layer 57 is formed and patterned to provide openings for electrical connection between the to-be-formed metalization interconnect pattern 26 and desired portions of source electrode 53 and gate electrode 54.

Figure 7A:
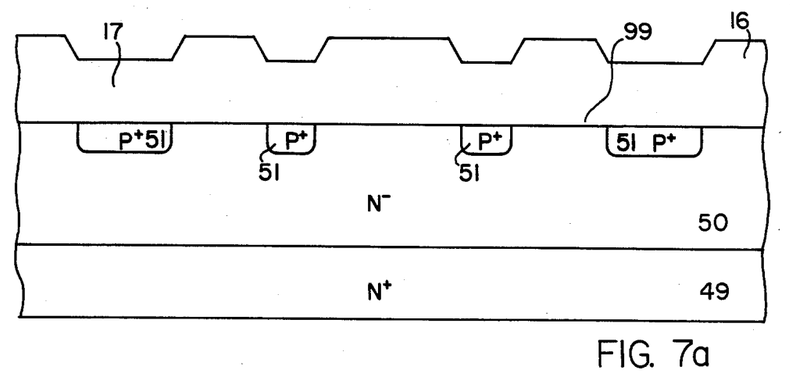
FIGS. 7a through 7h are cross-sectional views depicting the fabrication of an MOS transistor constructed in accordance with one embodiment of this invention.

FIGS. 7a through 7h are cross-sectional views depicting the fabrication of an MOS transistor constructed in accordance with one embodiment of this invention. As shown in FIG. 7a, an N type silicon substrate 49 having crystal orientation <100> and resistivity of approximately 0.015 ohm-cm is used. Formed on substrate 49 is N type epitaxial silicon layer 50. Epitaxial layer 50 is formed for example, to a thickness of approximately 15 microns by the decomposition of $SiH_2Cl_2$ at approximately 1150° C. using $PH_3$ as the dopant source. Epitaxial layer 50 has a resistivity of approximately 1 ohm-cm. A layer of oxide 16 is then formed on the surface of epitaxial silicon layer 50 to a thickness within the range of approximately 7,000 to 8,000 Å. This oxide layer is formed, for example, by thermal oxidation in wet oxygen at a temperature of approximately 1100° C. for approximately 90 minutes.

This oxide layer 16 is then masked, using suitable well known photolithographic techniques, and patterned, for example, by etching with buffered HF, in order to expose those portions of epitaxial silicon layer 50 where P type body regions 51 are to be formed. A thin layer of oxide (not shown) of approximately 500 Å in thickness is then formed on the exposed portions of epitaxial silicon layer 50 where highly doped P type body regions 51 are to be formed. This thin layer of oxide is formed, for example, by exposing the wafer to dry oxygen at approximately 1050° C. for approximately 20 minutes. P type body regions 51 are then formed, for example, by the ion implantation of boron at approximately 60 KEV to a dosage of approximately $7.0 \times 10^{13}$ atoms/cm$^2$. The boron dopants are then diffused to a junction depth (i.e., the depth below surface 99 where the P type dopant concentration equals the N type dopant concentration) of approximately 2.0 microns, for example, during an oxidation step wherein the wafer is subjected to dry oxygen for approximately 145 minutes at approximately 1100° C., followed by wet oxygen for approximately 60 minutes at approximately 1100° C., followed by dry nitrogen for approximately 360 minutes at approximately 1100° C. Following this step of oxidation and diffusing boron dopant in regions 51, the cross-sectional view of the structure is shown in FIG. 7a, with oxide layer 17 having a thickness within the range of approximately 6000–7000 Å above P regions 51, and oxide layers 16 and 17 (hereinafter simply referred to as oxide 17) having a combined thickness of approximately 10,000 Å in all other locations.

Figure 7B:
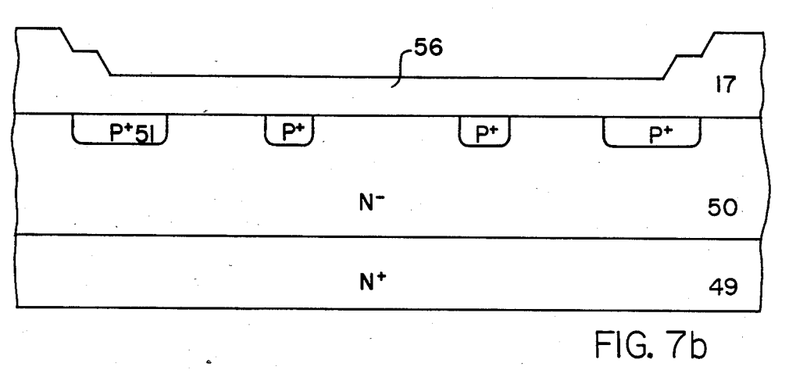

As shown in FIG. 7b, the location on the surface of the wafer where grooves are to be formed is defined, for example, by utilizing well known photolithographic techniques. The portion of oxide layer 17 within this area is then removed, for example by etching with buffered hydroflouric acid. A layer of gate oxide 56 is then formed to a thickness of approximately 2000 Å, for example, by subjecting the wafer to wet oxygen at approximately 900° C. for approximately 90 minutes, followed by dry oxygen for approximately 10 minutes at approximately 900° C., followed by dry nitrogen for approximately 10 minutes at approximately 900° C.

Figure 7C:
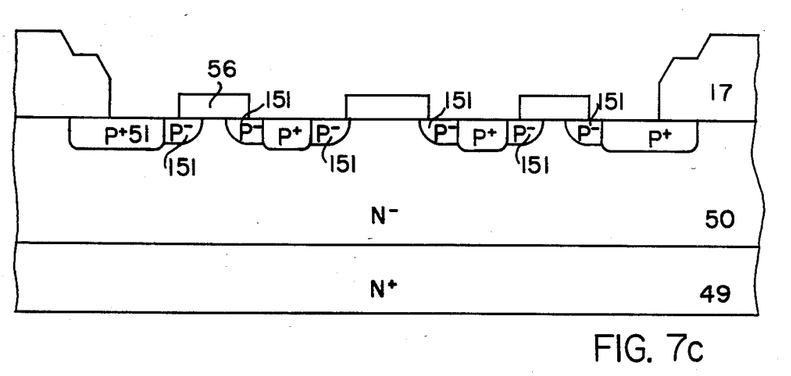

As shown in FIG. 7c, the gate oxide layer 56 is then defined, for example by applying a layer of photoresist (not shown) and, patterning the photoresist utilizing well known photolithographic techniques to expose those portions of gate oxide 56 where each groove is to be formed. Gate oxide 56 is then patterned, for example by etching the exposed portions of gate oxide 56 with buffered HF, to expose those portions of the surface of N type epitaxial silicon layer 50 where each groove is to be formed. Lightly doped P region 151 is then formed, for example by the ion implantation of boron at approximately 60 Kev to a dosage of approximately $6.0 \times 10^{13}$ atoms/cm$^2$. Of importance, oxide 17, the remaining portions of gate oxide 56, and the remaining portions of the photoresist (not shown) serve as a mask, thereby preventing the implantation of boron into regions other than regions 51 and 151. During this introduction of boron into body regions 151, additional boron is introduced into the exposed portion of P type body region 51.

The photoresist is then removed. The dopants within region 151 are then diffused to a junction depth of approximately 2.0 microns, for example, by increasing the temperature of the wafer from room temperature to approximately 1100° C. within approximately 25 minutes in a dry nitrogen atmosphere, followed by subjecting the wafer to a dry nitrogen atmosphere at approximately 1100° C. for approximately 400 minutes, followed by decreasing the temperature of the wafer to room temperature within approximately 60 minutes in a dry nitrogen atmospher. During this diffusion step, the boron dopants within P type body region 51 are further diffused to a junction depth of approximately 3.0 microns.

Figure 7D:
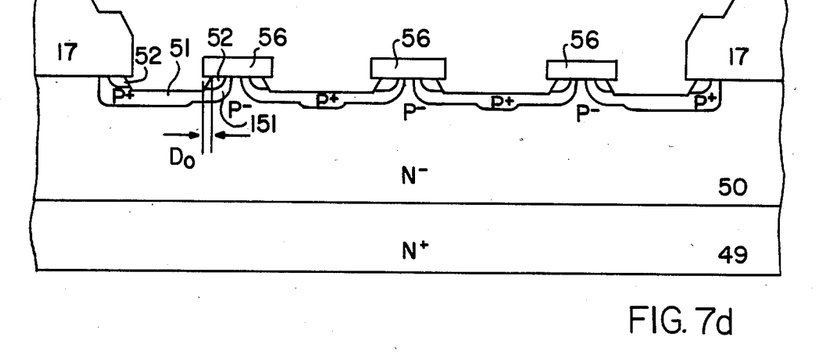

As shown in FIG. 7d, grooves are then etched in P type body regions 51 and 151 to a depth of approximately 0.08 mils (1 mil equals 0.001 inch, or approximately 25.4 microns). The formation of grooves in body regions 51 and 151 is accomplished, for example, by an isotropic etch for approximately 1.5 minutes using a solution of approximately 220 milliliters of 10 parts deionized water and one part HF and approximately 2200 milliliters of nitric acid. The grooves in P type body regions 51 and 151 are then further etched, for example, by exposing the wafer to an anisotropic etch for approximately 2 minutes, thereby providing the grooves in body regions 51 and 151 to a depth of approximately 0.06 mils and which undercut the oxide layers 17 and 56 by approximately 0.02 to 0.04 mils.

In accordance with one embodiment of this invention, the anisotropic etch is performed as follows. First, a clean etchant tank is provided. The etchant tank is filled with approximately 7520 milliliters of deionized water. Approximately 8 pounds of potassium hydroxide (KOH) is added to the deionized water in the etchant tank, and the potassium hydroxide/deionized water solution is stirred. The addition of KOH to deionized water releases a significant amount of heat, and thus the KOH solution is allowed to cool to approximately 60±1° C. When the anisotropic etch solution has reached the desired temperature, the wafer is dipped in the anisotropic etch solution for approximately 2 minutes.

Phosphorus dopant is then introduced into the exposed portions of body regions 51 and 151. This introduction of phosphorus is performed, for example, by increasing the temperature of the wafer to approximately 920° C. within approximately 5 minutes in a nitrogen atmosphere, followed by subjecting the wafer to an atmosphere of nitrogen and oxygen at approximately 920° C. for approximately 10 minutes, followed by subjecting the wafer to an atmosphere of nitrogen and oxygen gas plus POCl$_3$ as the dopant source at approximately 920° C. for aprpoximately 13 minutes, followed by subjecting the wafer to a nitrogen atmosphere at approximately 920° C. for approximately 5 minutes, followed by reducing the temperature of the wafer to approximately room temperature within approximately 5 minutes in a nitrogen atmosphere. Although not shown in FIG. 7d, at this time the phosphorus is formed around the entire periphery of the exposed portion of body regions 51 and 151. This phosphorus deposition also introduces phosphorus into gate oxide 56, thereby stabilizing the gate oxide by preventing the movement of mobile ions which can cause threshold voltage instability, as is well known. In order to remove undesired portions of the phosphorus dopant within body regions 51 and 151, thereby to leave only N type source regions 52 within body regions 151, an additional anisotropic etch of approximately 1.5 minutes is used to preferentially etch body regions 51 and 151 in the vertical direction and thereby remove the undesired portions of the N type phosphorus regions within body regions 51 and 151. This anisotropic etch, utilizing the same procedure described above in connection with the first anisotropic etch used, also slightly etches source regions 52 in a lateral direction, thereby providing that the gate oxide 56 overhangs the opening formed within body regions 51 and 151 a distance $D_o$ of approximately 0.04 to 0.06 mils.

Figure 7E:
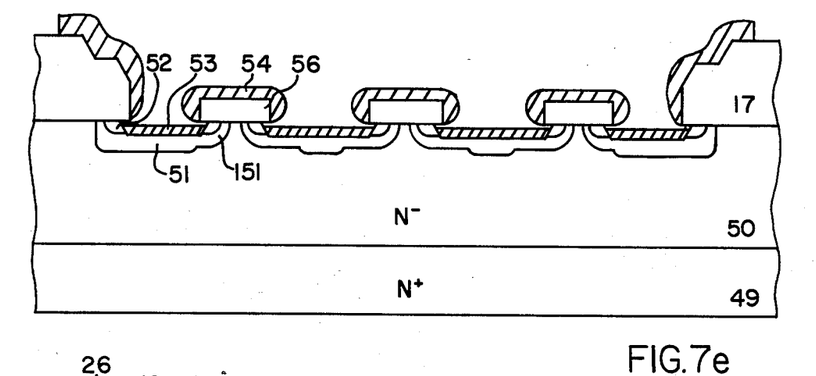

As shown in FIG. 7e, a layer of metal, such as aluminum or an alloy of aluminum, is formed on the surface of the wafer. This is performed, for example, by evaporating aluminum at approximately 250° C. in a well known manner, thereby providing an aluminum layer of approximately 8000 Å in thickness. Of importance, this evaporation of aluminum forms source electrodes 53 within the grooves cut into body regions 51 and 151, thereby allowing electrical connection to both body regions 51 and 151 and source region 52. Simultaneously, this evaporation of aluminum forms gate electrodes 54. Of importance, the overhang $D_o$ provided by gate oxide 56 allows the simultaneous formation of source electrodes 53 and gate electrode 54 while ensuring that source electrode 53 and gate electrode 54 are not physically or electrically connected. This physical and electrical separation of source electrode 53 and gate electrode 54 occurs, as shown in FIG. 7e, beneath the overhang of gate insulation layer 56. Source electrode 53 and gate electrode 54 are separated by a gap of approximately one micron.

The metallization on the surface of the device is then defined into a desired first layer interconnect pattern. This is accomplished, for example, by utilizing well known photolithographic techniques to expose those portions of metallization which are to be removed. The exposed portions of the metallization are then removed, for example, by etching in a solution comprised of acetic, nitric and phosphoric acids.

After the first layer of metallization is defined, the wafer is placed in a nitric acid etch at 85° C. for about two (2) to four (4) minutes depending on the thickness and other characteristics of the aluminum to remove any fingers of metal which may extend between the source metallization and gate metallization. This step is followed by a deionized water rinse. This step, in turn, is followed by a water boil to grow a thin layer of aluminum oxide on the aluminum metallization thereby to destroy any remaining conductive aluminum fingers from the source metallization to the gate metallization.

Later in the process, any aluminum oxide overlying the contact areas on the aluminum is removed by the etch that forms the vias through any overlying insulation.

Figure 7F:
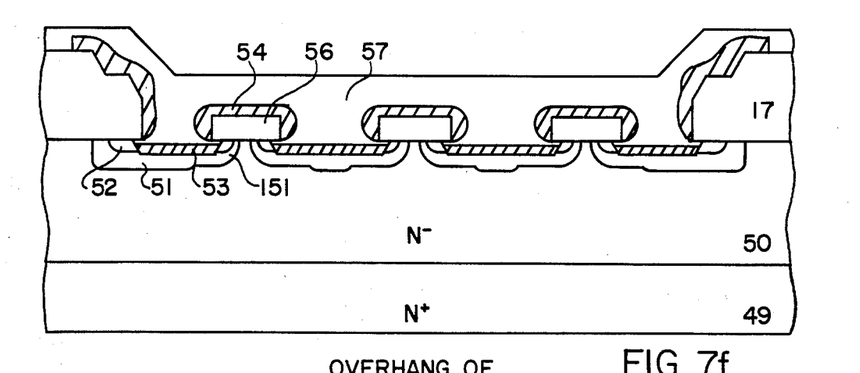

As shown in FIG. 7f, a layer of insulation 57 is then formed on the surface of the device to a thickness of approximately 10,000 Å. This insulation layer 57 is, for example, SiO$_2$ formed as described in an article by Rosler entitled "Low Pressure CVD Production Processed for Poly, Nitride, and Oxide", Solid State Technology, April 1977, pages 63 through 70, which is hereby incorporated by reference. Of importance, insulation layer 57 is formed at or below approximately 400° C., in order to prevent damage to metallic gate electrode 54 and metallic source electrode 53. The insulation layer 57 is then defined, for example, by utilizing well known photolithographic techniques, and etched, for example with buffered HF, thereby exposing those portions of source electrode 53 and gate electrode 54 which are to be contacted by a to-be-formed second metal layer which is to serve as electrical interconnects on the device surface.

Figure 7G:
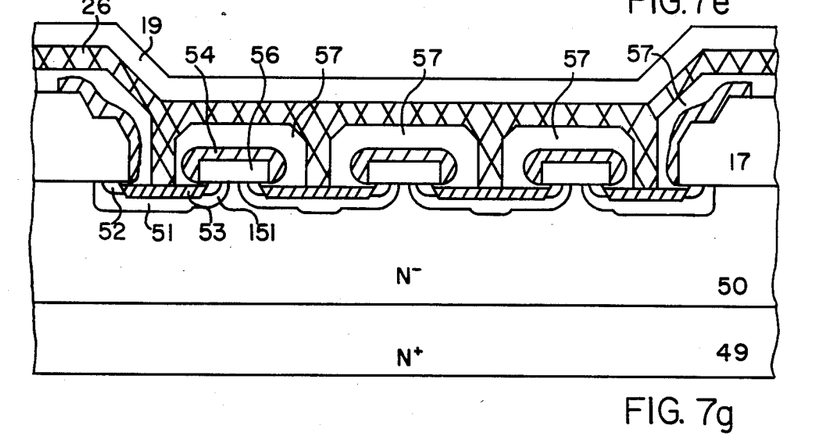
Figure 7H:
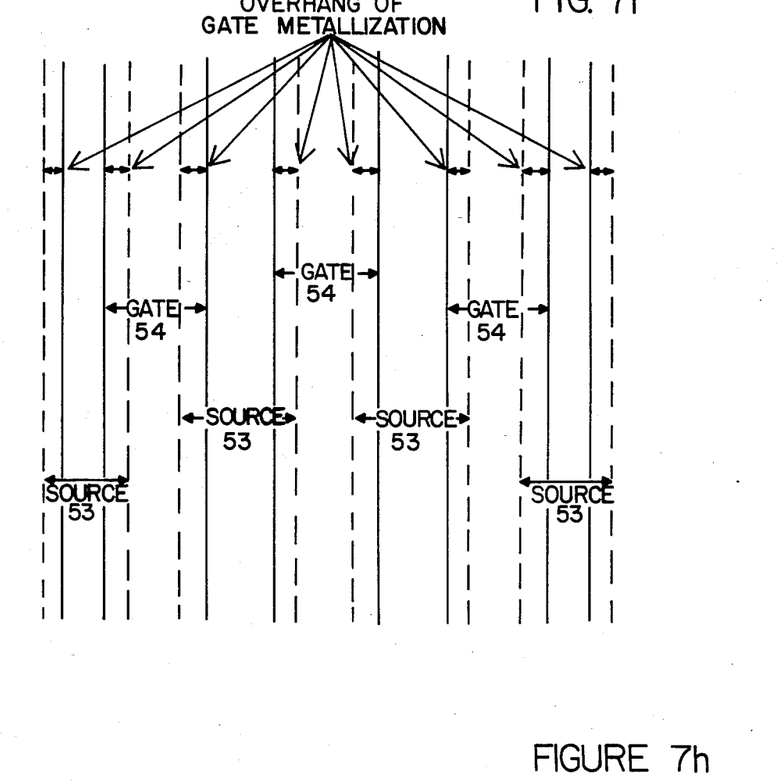

FIG. 7h shows a plan view of the device depicted in the cross-sectional view of FIG. 7f. As shown in FIG. 7h, the gate metallization 54 overhangs the source metallization 53, although as previously described and as shown in FIG. 7e, gate metallization 54 is physically and electrically separated from source metallization 53 beneath the overhang provided by gate insulation 56.

A conductive interconnect layer 26 (FIG. 7g) is then formed on the surface of the device and into the openings formed within insulation layer 57, for example, by evaporating aluminum at approximately 250° C. in a well known manner, thereby forming a second layer of aluminum metal 26 to a thickness of approximately 18,000Å. Metallization layer 26 is then alloyed in order to form ohmic contacts between aluminum metalization 53 and source 52 and body regions 51 and 151. Alloying also removes radiation damage caused by electron beam evaporation of the aluminum. This alloying of metal layer 26 is performed, for example, by placing the wafer in a furnace at approximately 450° C. in a dry nitrogen atmosphere, followed by subjecting the wafer to a dry hydrogen atmosphere at approximately 450° C. for approximately 120 minutes, followed by approximately 5 minutes in dry nitrogen at approximately 450° C., followed by decreasing the temperature of the wafer to room temperature in a dry nitrogen atmosphere by removing the wafer from the furnace. The layer of aluminum 26 is then defined, for example, by well known photolithographic techniques and patterned, for example, by etching with a solution of acetic, nitric and phosphoric acids, thereby to form the desired electrical interconnect pattern on the surface of the device.

If desired, a scratch protection layer 19 is then formed on the surface of the device. Scratch protection layer 19 is formed, for example, to a thickness of approximately 8,000Å by low pressure chemical vapor deposition of silicon nitride at or below approximately 400° C. Openings within scratch protection layer 19 are then formed to allow electrical connection to desired locations on the metal interconnect pattern 26. Openings (not shown) within scratch protection layer 19 are defined, for example, utilizing well known photolithographic techniques, and the openings are formed within scratch protection layer 19, for example, by etching with a plasma of CF$_4$ gas plus approximately 4% O$_2$.

In accordance with another embodiment of this invention, the second metallization layer 26 is not used, and the desired electrical interconnects formed on the surface of the wafer are provided by the first metallization layer which is used to form source electrode 53 and gate electrode 54. However, the use of a second metallization interconnect layer allows the formation of more complex devices having more complex interconnect patterns. In order to form a transistor in accordance with this invention which utilizes only a single metal layer, the aforementioned process is used with the appropriate deletion of the steps used to form and define insulation layer 57 and metal layer 26.

Figure 8:
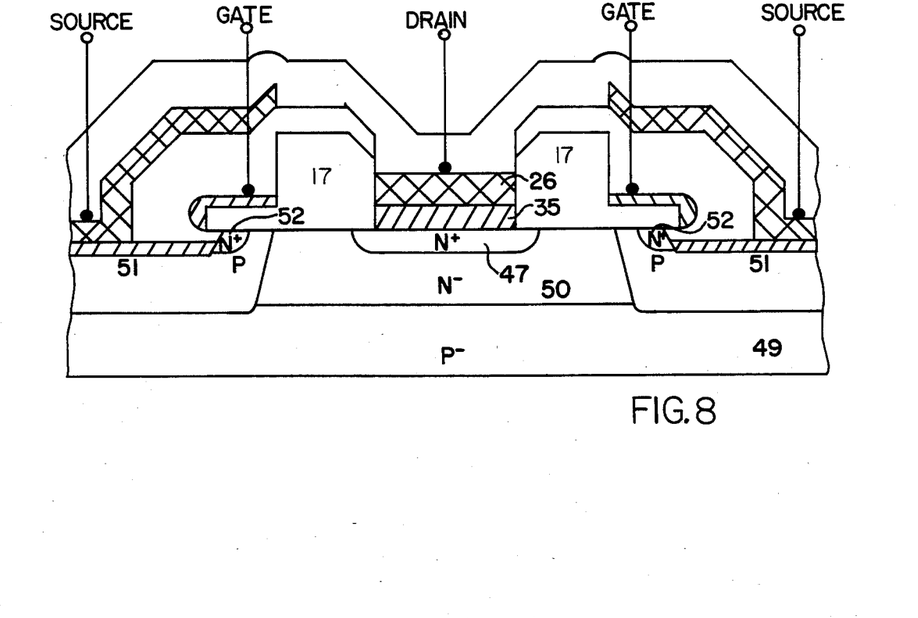
FIG. 8 is a cross-sectional view depicting an MOS transistor constructed in accordance with another embodiment of this invention.

In accordance with another embodiment of this invention, a lateral MOS transistor is constructed. As shown in FIG. 8, N type epitaxial silicon layer 50 is formed on a P type substrate 49. P type body region 51 is formed as previously described. Simultaneously with the formation of N type source region 52, N type drain region 47 is formed, utilizing an appropriate mask to define the required opening in oxide layer 17. N type drain 47 is then protected, for example by a thin layer of SiO$_2$ formed in a well known manner, during the previously mentioned second anisotropic etch wherein the N+ regions within body region 51 other than source region 52 are removed. The first and second metallization layers then form layers 35 and 26, respectively, allowing electrical interconnection to drain region 47.

In accordance with another embodiment of this invention, a lateral transistor is formed as in FIG. 8, without the formation of second level electrical interconnect layer 26.

In yet another embodiment of this invention, highly doped P type body region 51 is not utilized. The transistor of this embodiment of the invention functions in a similar manner as the transistors of the previously described embodiments of this invention, except for a slightly increased resistance between body region 151 and source metallization 53. In order to form this embodiment to the invention, the above mentioned process steps are utilized, with the exception of the doping and diffusion steps used to form P type body region 51.

The transistors constructed in accordance with this invention provide distinct advantages over priot art transistors. First, the minimum transistor cell size is reduced to approximately 15 microns between the centers of adjacent interdigitated grooves as compared with prior art transistors have a typical minimum cell size of 23 microns for the transistor of FIG. 5, and a typical minimum cell size of 41 microns for the transistor of FIG. 1, thus resulting in a significant reduction in output capacitance. In contrast to the prior art MOS transistors, wherein the output capacitance is approximately 8 pF per centimeter of channel width (for the transistor of FIG. 5) and approximately 7 pF per centimeter of channel width (for the transistor of FIG. 1), the output capacitance of the transistors constructed in accordance with this invention is typically approximately 3.5 pF per centimeter of channel width. As previously described, the output capacitance of the transistor constructed in accordance with this invention (FIG. 6) is caused by the capacitance of the PN junction formed by P type body region 51, 151 and N type epitaxial region 50. Accordingly, the power gain bandwidth, which is inversely proportional to the output capacitance, as previously described, will be greater for a transistor constructed in accordance with this invention, as compared to the power gain bandwidth of prior art devices.

Furthermore, the input capacitance, which is caused by the area of overlays of the gate electrode 54 and source region 52 (FIG. 6), is reduced over prior art MOS transistors. Prior art MOS transistors typically have an input capacitance of approximately 9.3 pF per centimeter of channel width as compated with the input capacitance of the transistors constructed in accordance with this invention, which is approximately 7.6 pF per centimeter of channel width. As previously described, the maximum operating frequency $f_t$ is inversely proportional to the input capacitance. Thus, the maximum operating frequency of the transistors constructed in accordance with this invention is significantly greater than the maximum operating frequency of prior art devices.

The channel length L of the transistors of this invention is also less than the channel length of prior art devices, thereby further increasing the transconductance (which, as shown in equation (3), is inversely proportional to the square of the channel length), thereby increasing the maximum operating frequency $f_t$.

The improved characteristics of a transistor constructed in accordance with this invention (FIG. 6) as compared to the prior art transistor of FIG. 5 at an operating test frequency of 175 MHz and a supply of voltage $V_{DD}$ of 28 volts is depicted in Table I:

TABLE I

|  | FIG. 5 Device | FIG. 6 Device |
| --- | --- | --- |
| Output power | 20 watts | 23 watts |
| Power gain | 10 db | 13.7 db |
| Efficiency | 60% | 69% |

While specific embodiments of this invention have been presented in the specification, these specific embodiments are intended to serve by way of example only and are not to be construed as limitations on the scope of this invention. Numerous other embodiments of this invention will become readily apparent to those with ordinary skill in the art in light of the teachings of this specification.

We claim:

1. The method of forming a MOS transistor comprising the steps of:
    forming an insulation layer on the surface of a first semiconductor region of a first conductivity type;
    forming within said first semiconductor region a body region of a second conductivity type opposite said first conductivity type, the steps of forming said body region comprising
        masking and selectively removing a portion of said insulation layer, thereby leaving an exposed portion of said first semiconductor region,
        introducing dopants of said second conductivity type into said exposed portion of said first semiconductor region to a first density level,
        diffusing said dopants of said second conductivity type into said first semiconductor region,
    removing portions of said insulation layer,
    forming a layer of gate oxide,
    masking and selectively removing said layer of gate oxide, thereby leaving exposed portions of said first conductive region and said body region,
    introducing dopants of said second conductivity type into said exposed portions of said first conductive region and said body region to a second density level,
    again diffusing said dopants of said second conductivity type;
    etching said exposed portion of said body region wherein a portion of said body region beneath said insulation layer is also etched in a lateral direction;
    introducing dopants of said first conductivity type into said exposed portion of said body region;
    preferentially etching in a vertical direction said exposed portion of said body region, thereby removing said dopants of said first conductivity type from within that portion of said body region which is not located beneath said insulation layer, and thereby leaving said dopants of said first conductivity type beneath said insulating layer to form a source region; and
    forming a conductive layer on the surface of said MOS transistor, thereby simultaneously forming a gate electrode on the surface of said insulation layer, and a source electrode on said exposed portion of said body region and said source region, said source electrode extending beneath said insulation layer, wherein said gate electrode is physically and electrically separated from said source electrode.

2. The method as in claim 1 which further comprises the step of forming an epitaxial layer on a semiconductor substrate, said epitaxial layer serving as said first semiconductor region.

3. The method as in claim 1 which further includes the steps of:
    forming a second insulation layer on said source and gate electrodes, and exposed area of said source region;
    forming vias in said second insulation layer to expose selected portions of said source and gate electrodes;
    forming a conductive interconnect layer on said second insulation layer, said conductive interconnect layer being formed in said vias so as to contact said selected portions of said source and gate electrodes.

4. The method as in claim 1 wherein said MOS transistor comprises silicon.

5. The method as in claim 1 wherein said first conductivity type is N and said second conductivity type is P.

6. The method as in claim 1 wherein said first conductivity type is P and said second conductivity type is N.

7. The method as in claim 1 in which an MOS transistor is formed by the step of forming a drain region of said first conductivity type within said first region.

8. The method as in claim 1 wherein said step of etching said selected portion of said body region comprises the steps of:
   isotropically etching said selected portion of said body region; and
   anisotropically etching said selected portions of said body region.

9. The method as in claim 1 wherein said MOS transistor comprises silicon having a <100> crystal orientation.

10. The method as in claim 1 wherein said insulation layer comprises a material selected from the group of materials consisting of oxides of silicon and silicon nitride.

11. The method as in claim 1 wherein said source and gate electrodes comprise a material selected from the group of materials consisting of aluminum, alloys of aluminum, gold, and polycrystalline silicon.

12. The method as in claim 1 wherein said method further includes the step of removing any portions of said conductive layer which are formed between said gate electrode and said source electrode.

13. The method as in claim 3 which further includes the step of forming a scratch protection layer on said electrical interconnect layer.

14. The method as in claim 1 including, after leaving an exposed portion of said first semiconductor region, the step of applying a thin oxide layer to said exposed portion of said first semiconductor region.

15. The method as in claim 1 wherein said step of etching said exposed portion of said body region comprises the steps of:
   isotropically etching said selected portion of said body region; and
   an isotropically etching said selected portion of said body region.

16. The method as in claim 5 wherein said body region is formed by the introduction of boron dopants.

17. The method as in claim 5 wherein said step of introducing a dopant of said first conductivity type into the exposed portion of said body region comprises the step of introducing phosphorus.

18. The method as in claim 12 wherein said step of removing comprises:
   exposing the surface of the wafer to nitric acid;
   washing the surface of the wafer; and
   exposing the surface of the wafer to boiling water.

19. This method as in claim 12 wherein said step of removing comprises:
   exposing the surface of the wafer to nitric acid at approximately 85° C. for approximately two to four minutes;
   rinsing the wafer with deionized water; and
   exposing the surface of the wafer to boiling water;
   whereby any conductive material formed between said source electrode and said gate electrode is removed.

20. The method as in claim 19 wherein said conductive layer comprises aluminum or an alloy of aluminum.

21. The method of forming an MOS transistor comprising the steps of:
   forming an epitaxial layer of a first conductivity type on a substrate of a second conductivity type;
   forming an insulation layer on the surface of said epitaxial layer;
   forming within said epitaxial layer a body region of said second conductivity type, the steps of forming said body region comprising
   masking and selectively removing a portion of said insulation layer, thereby leaving an exposed portion of said epitaxial layer;
   introducing dopants of said second conductivity type into said exposed portions of said epitaxial layer, to a first density level;
   diffusing said dopants of said second conductivity type into said first epitaxial layer;
   removing portions of said insulation layer;
   forming a layer of oxide;
   masking and selectively removing said layer of oxide, thereby leaving exposed portions of said epitaxial layer and said body region;
   introducing dopants of said second conductivity type into said exposed portions of said epitaxial layer and said body region, to a second density level;
   again diffusing said dopants of said second conductivity type;
   etching said exposed portion of said body region, wherein a portion of said body region beneath said insulation layer is also etched in a lateral direction;
   exposing an additional portion of said epitaxial layer which will serve as a drain region;
   introducing dopants of said first conductivity type into said exposed portion of said body region;
   protecting said portion of said epitaxial layer which will serve as a drain region;
   preferentially etching in a vertical direction said exposed portion of said body region, thereby removing said dopants of said first conductivity type from within that portion of said body region which is not located beneath said insulation layer, and thereby leaving said dopants of said first conductivity type beneath said insulating layer to form a source region;
   exposing said portion of said epitaxial layer which will serve as a drain region; and
   forming a conductive layer on the surface of said MOS transistor, thereby simultaneously forming a drain electrode, a gate electrode on the surface of said insulation layer, and a source electrode on said exposed portion of said body region and said source region, said source electrode extending beneath said insulation layer, wherein said gate electrode is physically and electrically separated from said source and drain electrodes.

22. The method as in claim 21 which further includes the steps of:
   forming a second insulation layer on said source and gate electrodes and exposed areas of said first conductivity type;
   forming vias in said second insulation layer to expose selected portions of said source, drain, and gate electrodes;
   forming a conductive interconnect layer on said second insulation layer, said conductive interconnect layer being forming in said vias so as to contact said selected portions of said source, drain, and gate electrodes.

23. The method as in claim 21 including, after leaving an exposed portion of said epitaxial layer, the step of applying a thin oxide layer to said exposed portion of said epitaxial layer.

24. The method as in claim 21 wherein said step of etching said exposed portion of said body region comprises the steps of:
  isotropically etching said selected portion of said body region; and
  an isotropically etching said selected portion of said body region.

* * * * *

UNITED STATES PATENT AND TRADEMARK OFFICE
CERTIFICATE OF CORRECTION

PATENT NO. : 4,561,168
DATED : December 31, 1985
INVENTOR(S) : DORMAN C. PITZER, EDWARD J. RICE It is certified that error appears in the above—identified patent and that said Letters Patent is hereby corrected as shown below:

Col. 3, line 37, "$\zeta$" (zeta) should read -- $\theta$ -- (theta);

Col. 7, line 52, "atmospher" should read --atmosphere--;

Col. 11, line 32, "compated" should read --compared--.

Col. 13, line 44 (Claim 15), "an isotropically" should read --anisotropically--;

Col. 16, line 5 (Claim 24), "an isotropically" should read --anisotropically--.

Signed and Sealed this

Twenty-fourth Day of June 1986

[SEAL]

Attest:

DONALD J. QUIGG

Attesting Officer     Commissioner of Patents and Trademarks